US010141837B2

(12) United States Patent
Gao et al.

(10) Patent No.: US 10,141,837 B2
(45) Date of Patent: Nov. 27, 2018

(54) DEVICE AND METHOD FOR ENERGY HARVESTING USING A SELF-OSCILLATING POWER-ON-RESET START-UP CIRCUIT WITH AUTO-DISABLING FUNCTION

(71) Applicants: AGENCY FOR SCIENCE, TECHNOLOGY AND RESEARCH, Singapore (SG); NANYANG TECHNOLOGICAL UNIVERSITY, Singapore (SG)

(72) Inventors: Yuan Gao, Singapore (SG); Abhik Das, Singapore (SG); Tae-Hyoung Kim, Singapore (SG)

(73) Assignees: Agency for Science, Technology and Research, Singapore (SG); Nanyang Technological University, Singapore (SG)

( * ) Notice: Subject to any disclaimer, the term of this patent is extended or adjusted under 35 U.S.C. 154(b) by 0 days.

(21) Appl. No.: 15/538,169

(22) PCT Filed: Jan. 20, 2016

(86) PCT No.: PCT/SG2016/050022
§ 371 (c)(1),
(2) Date: Jun. 20, 2017

(87) PCT Pub. No.: WO2016/118083
PCT Pub. Date: Jul. 28, 2016

(65) Prior Publication Data
US 2018/0019661 A1 Jan. 18, 2018

(30) Foreign Application Priority Data

Jan. 21, 2015 (SG) ............................ 10201500477Y

(51) Int. Cl.
*H02M 1/36* (2007.01)
*H02M 3/156* (2006.01)
(Continued)

(52) U.S. Cl.
CPC .............. *H02M 1/36* (2013.01); *G06F 1/04* (2013.01); *G06F 1/26* (2013.01); *H02J 50/00* (2016.02);
(Continued)

(58) Field of Classification Search
CPC ................. H02M 1/36; H02M 3/156; H02M 2003/1552; H02M 3/155; H02M 3/145;
(Continued)

(56) References Cited

U.S. PATENT DOCUMENTS

2007/0278861 A1 12/2007 Lou et al.
2010/0270996 A1 10/2010 Ramadas et al.
(Continued)

OTHER PUBLICATIONS

State IP Office of Singapore; Notification of Transmittal of the International Search Report and the Written Opinion of the International Search Authority, or the Declaration for counterpart International Application No. PCT/SG2016/097191, 8 pages (dated Mar. 26, 2016).
(Continued)

*Primary Examiner* — Nguyen Tran
(74) *Attorney, Agent, or Firm* — Womble Bond Dickinson (US) LLP

(57) ABSTRACT

Device and method for energy harvesting using a self-oscillating power-on reset start-up circuit. The device for energy harvesting comprises a start-up circuit for generating self-oscillation and initial boosting of an input voltage from an energy source during a start-up phase; a main boost circuit for boosting the input voltage during a steady state phase; a clock generator circuit for generating clock signals (Continued)

which control voltage boosting of the main boost circuit during the steady state phase; and a switching circuit coupled to the start-up circuit, the main boost circuit and the clock generator circuit for switching powering of the clock generator circuit between the start-up circuit and the main boost circuit such that the clock generator circuit is powered by only one of the start-up circuit and the main boost circuit at any point in time.

20 Claims, 8 Drawing Sheets

(51) Int. Cl.
*G06F 1/04* (2006.01)
*H03K 19/00* (2006.01)
*G06F 1/26* (2006.01)
*H02J 50/00* (2016.01)
*G05F 3/08* (2006.01)
*H03K 19/0175* (2006.01)

(52) U.S. Cl.
CPC ........ *H02M 3/156* (2013.01); *H03K 19/0016* (2013.01); *G05F 3/08* (2013.01); *H03K 19/017581* (2013.01); *H05K 999/99* (2013.01)

(58) Field of Classification Search
CPC ......... H02M 3/158; H02M 2001/0045; H02M 3/1588; H02M 3/157; H02M 2001/0012; G05F 1/445; G05F 1/45; G05F 1/455; G05F 1/563; G05F 1/61; G05F 1/614
USPC ....... 323/222, 223, 238, 266, 271, 282–285, 323/288, 299; 363/49
See application file for complete search history.

(56) References Cited

U.S. PATENT DOCUMENTS

| 2011/0134665 A1* | 6/2011 | Ivanov | H02M 1/36 363/49 |
| 2013/0241507 A1* | 9/2013 | Hara | G05F 1/10 323/282 |
| 2014/0268936 A1 | 9/2014 | Lu et al. | |
| 2016/0087526 A1* | 3/2016 | Satake | H02M 3/156 323/282 |

OTHER PUBLICATIONS

State IP Office of Singapore; Notification of Transmittal of International Preliminary Report on Patentability (IPRP) for counterpart International Application No. PCT/SG2016/097191 with IPRP, 6 pages (dated Apr. 18, 2017).

Blanco, A., et al., "On-chip Starter Circuit for Switched-inductor DC-DC Harvester Systems," 2013 *IEEE International Symposium on Circuits and Systems* (May 23, 2013) pp. 2723-2726.

* cited by examiner

DEVICE AND METHOD FOR ENERGY HARVESTING USING A SELF-OSCILLATING POWER-ON-RESET START-UP CIRCUIT WITH AUTO-DISABLING FUNCTION

CROSS-REFERENCE TO RELATED APPLICATIONS

This patent application is a U.S. National Phase application under 35 U.S.C. § 371 of International Application No. PCT/SG2016/050022, filed on Jan. 20, 2016, entitled DEVICE AND METHOD FOR ENERGY HARVESTING USING A SELF-OSCILLATING POWER-ON-RESET START-UP CIRCUIT WITH AUTO-DISABLING FUNCTION, which claims priority from Singapore Patent Application No. 10201500477Y filed on Jan. 21, 2015.

FIELD OF INVENTION

This embodiment broadly relates to an energy harvesting device and an energy harvesting method and in particular, relates to an energy harvesting device and an energy harvesting method using a self-oscillating power-on reset start-up circuit with automatic disabling function.

BACKGROUND TO THE INVENTION

Batteryless sensors, which harvest ambient energy as alternative power sources for long-term self-supplied operation, can have promising potentials for biomedical and wearable applications. Among various energy sources, thermal heat can provide an important energy source for implantable and wearable sensors because thermal heat can be easily accessible from the human body. However, due to constraints on thermoelectric generator (TEG) physical dimensions and a limited temperature difference between the human body and the environment, a TEG usually exhibits sub-mW output power and low output voltage (e.g., ranging from a few hundred millivolts) which cannot be directly utilized to power electronic circuits. In addition, to achieve full energy autonomy, a self-start-up function is effective to kick start system operation from a cold-state. Therefore, major design challenges in a thermoelectric energy harvester system include designing a low voltage self-start-up circuit and a high efficiency boost converter for a low voltage power source.

Different approaches have been reported to achieve low start-up voltage of TEG energy harvesting by utilizing Micro-electro-mechanical Systems (MEMS) mechanical switch, transistor threshold voltage trimming, off-chip transformer and auxiliary LC oscillator to kick start a boost converter operation. However these approaches require external motion force to trigger start up, large system size, or increased fabrication cost or may lack a shut-down mechanism for an electrical start-up circuit leading to leakage current causing significant efficiency degradation during a normal operation mode.

Thus, what is needed is a method and device for energy harvesting to provide an efficient solution to minimize power consumption of the start-up circuit during system steady-state operation by automatic disabling the start-up circuit during steady state operation. Furthermore, other desirable features and characteristics will become apparent from the subsequent detailed description and the appended claims, taken in conjunction with the accompanying drawings and this background of the disclosure.

SUMMARY OF THE INVENTION

In accordance with one aspect of the present embodiments, a device for energy harvesting is disclosed. The device for energy harvesting comprises a start-up circuit for generating self-oscillation and initial boosting of an input voltage from an energy source during a start-up phase; a main boost circuit for boosting the input voltage during a steady state phase; a clock generator circuit for generating clock signals which control voltage boosting of the main boost circuit during the steady state phase; and a switching circuit coupled to the start-up circuit, the main boost circuit and the clock generator circuit for switching powering of the clock generator circuit between the start-up circuit and the main boost circuit such that the clock generator circuit is powered by only one of the start-up circuit and the main boost circuit at any point in time.

In accordance with another aspect of the present embodiments, a method for energy harvesting is disclosed. The method for energy harvesting comprises generating a sequence of pulses for control of the self-oscillation using a power-on reset circuit; generating a sequence of clock signals from the sequence of pulses using an inverter chain buffer; boosting an input voltage of the start-up circuit from the sequence of clock signals using an auxiliary boost circuit controlled by the power-on reset circuit; and powering the clock generator in response to the boosted voltage from the auxiliary boost circuit and the sequence of clock signals from the inverter chain buffer.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with a present embodiment, by way of non-limiting example only.

Embodiments of the invention are described hereinafter with reference to the following drawings, in which:

FIG. 6, comprising FIGS. 6A-6B, are graphs depicting examples of measured start-up transient voltage waveforms with an input voltage of the energy harvesting device at 220 mV in accordance with the present embodiment, wherein FIG. 6A depicts an overall measured start-up transient voltage waveform and FIG. 6B depicts a zoom-in measured start-up transient voltage waveform.

Skilled artisan will appreciate that elements in the figures are illustrated for simplicity and clarity and have not necessarily been depicted to scale.

DETAILED DESCRIPTION

The following detailed description is merely exemplary in nature and is not intended to limit the embodiments or the application and uses of the embodiments. Furthermore, there is no intention to be bound by any theory presented in the preceding background of the embodiments or the following detailed description. It is the intent of this embodiment to present a device and method for energy harvesting using a self-oscillating power-on reset start-up circuit with an auto-disabling function.

Figure 1:
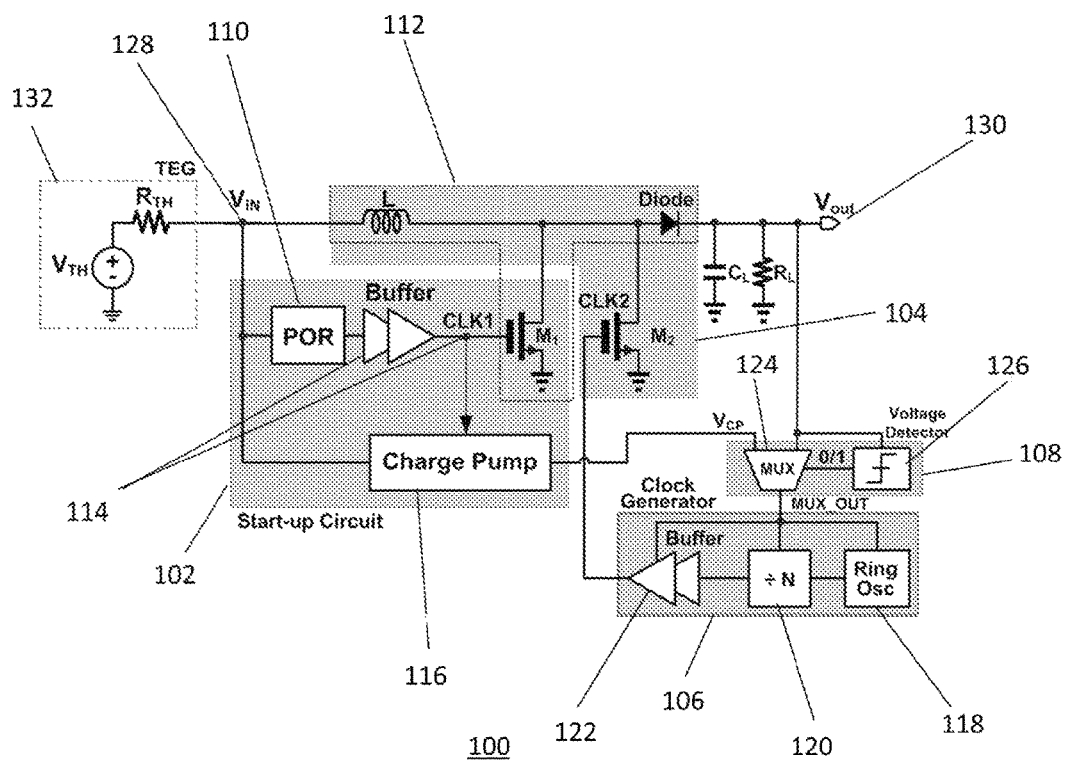
FIG. 1 is a schematic of a circuitry depicting an overall circuit configuration of an energy harvesting device in accordance with a present embodiment.

Referring to FIG. 1, a schematic of circuitry 100 depicts an overall circuit configuration of the device for energy harvesting in accordance to a present embodiment. As seen in FIG. 1, the device for energy harvesting can comprise a start-up circuit 102, a main boost circuit 104, a clock generator 106 and a switching circuit 108. In particular, the start-up circuit 102 can comprise a Power-On Reset (POR) circuit 110, an auxiliary boost circuit 112, an inverter chain buffer 114 and a charge-pump circuit 116. The main boost circuit 104 can be a boost converter circuit or any device capable of boosting the input voltage of the device for energy harvesting, $V_{IN}$ 128 which provides higher efficiency voltage boosting as compared to the auxiliary boost converter circuit 112. In the example embodiment, the main boost circuit 104 is a DC-DC boost converter circuit comprising an energy storage element and a switching device. With regards to the energy storage element, the main boost circuit 104 can also share a same off-chip energy storage element device with the auxiliary boost circuit 112. In this regards, the off-chip energy storage element device used in this example embodiment of the invention is an inductor L, however, other non-limiting examples of the off-chip energy storage element can also include a capacitor, a combination of both capacitor and inductor or any means to resist transient changes in voltage and/or current. The switching device coupled to the energy storage element is utilized for controlling the charging and/or discharging of the energy storage device to boost voltage at an output of the main boost circuit wherein the example circuitry described herein uses a transistor M2 as the switching device. In addition, the main boost circuit 104 can further comprise a diode coupled to the energy storage device and the switching device to prevent reverse biasing when the energy storage device is charging and/or discharging. The diode can be implemented in a passive or active manner. With regards to the clock generator circuit 106, it can comprise a ring oscillator 118, a frequency divider 120 and an inverter buffer 122. Last but not least, the switching circuit 108, which couples to the start-up circuit 102, the main boost circuit 104 and the clock generator circuit 106, can comprise a multiplexer 124 and a voltage detector circuit 126. As used herein, input voltage of the start-up circuit, input voltage of the POR circuit and input voltage of the device for energy harvesting all refers to the same voltage, $V_{IN}$. As used herein, output voltage of the main boost circuit and output voltage of the device for energy harvesting all refers to the same voltage, $V_{OUT}$.

Figure 2:
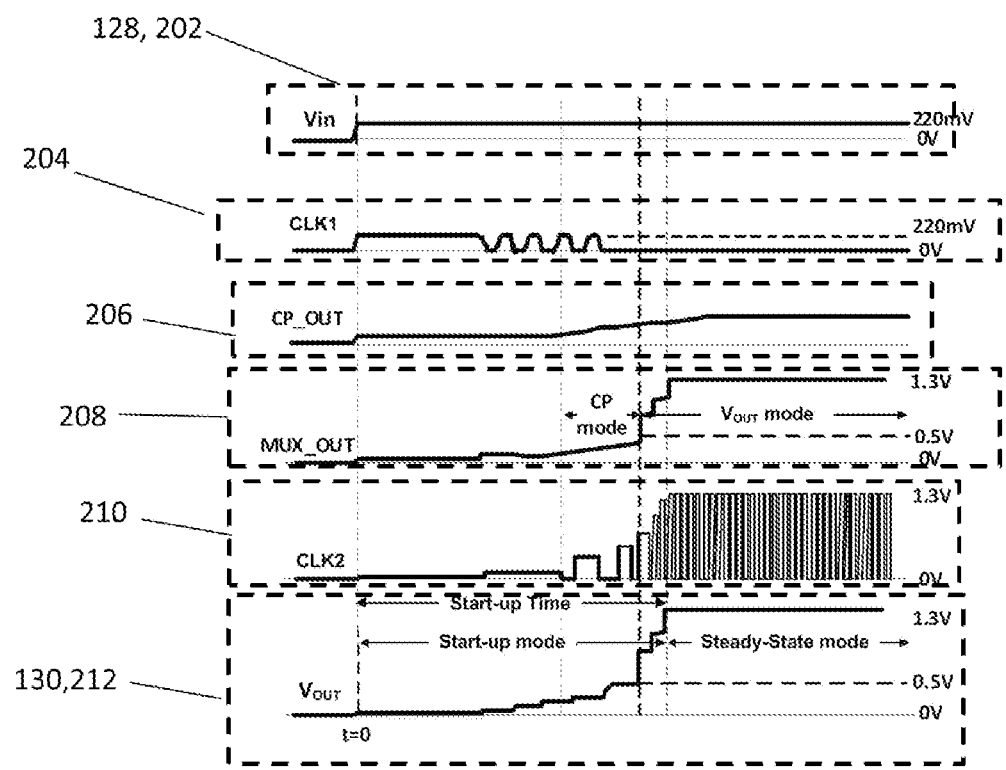
FIG. 2 is a graph depicting examples of time-based signals measured at various points within the circuitry of the energy harvesting device in accordance with the present embodiment.

Referring to FIG. 2, a graph depicts examples of time-based signals 200 measured at various points within the device for energy harvesting. As seen in FIG. 2, the POR circuit voltage output 204 may follow an input voltage of the POR circuit, $V_{IN}$ 202, from an energy source 132 until self-oscillations commence. The energy source 132 can refer to any low voltage energy sources for which non-limiting examples of the energy sources include thermoelectric generator (TEG) or solar powered generator. A sequence of pulses 208 can be generated before the POR circuit 204 resets completely, disabling the start-up circuit 102. Start-up circuit clock signal CLK1 204 can be generated by the inverter chain buffer 114 in response to an output voltage of the POR circuit 204, to drive the charge pump 116 and the auxiliary boost circuit 112 switch device M1. The charge pump voltage output 206, as used interchangeably herein as $V_{CP}$ and $CP_{out}$, can then be boosted and selected by the multiplexer as its voltage output 208. The output voltage of the multiplexer, as used interchangeably herein as VMUX or MUX_OUT, can be used to power the clock generator 106. When the clock generator 106 is fully powered up, the main boost circuit 104 can be activated to provide high efficiency voltage boosting. A voltage detector 126 can control the multiplexer 124 to switch the clock generator 106 voltage source power supply from $V_{CP}$ 206 to $V_{OUT}$ 212 when $V_{OUT}$ 212, the output voltage of the main boost circuit, surpasses a predefined threshold voltage. After the POR circuit 110 is reset, $CP_{out}$ 206 will decay due to the unavailability of the start-up circuit clock signals CLK1 204. Therefore, switching the clock generator power supply from $V_{CP}$ 206 to $V_{OUT}$ 212 is important so that steady state clock signals 210 of the device can be sustained for energy harvesting.

Figure 3:
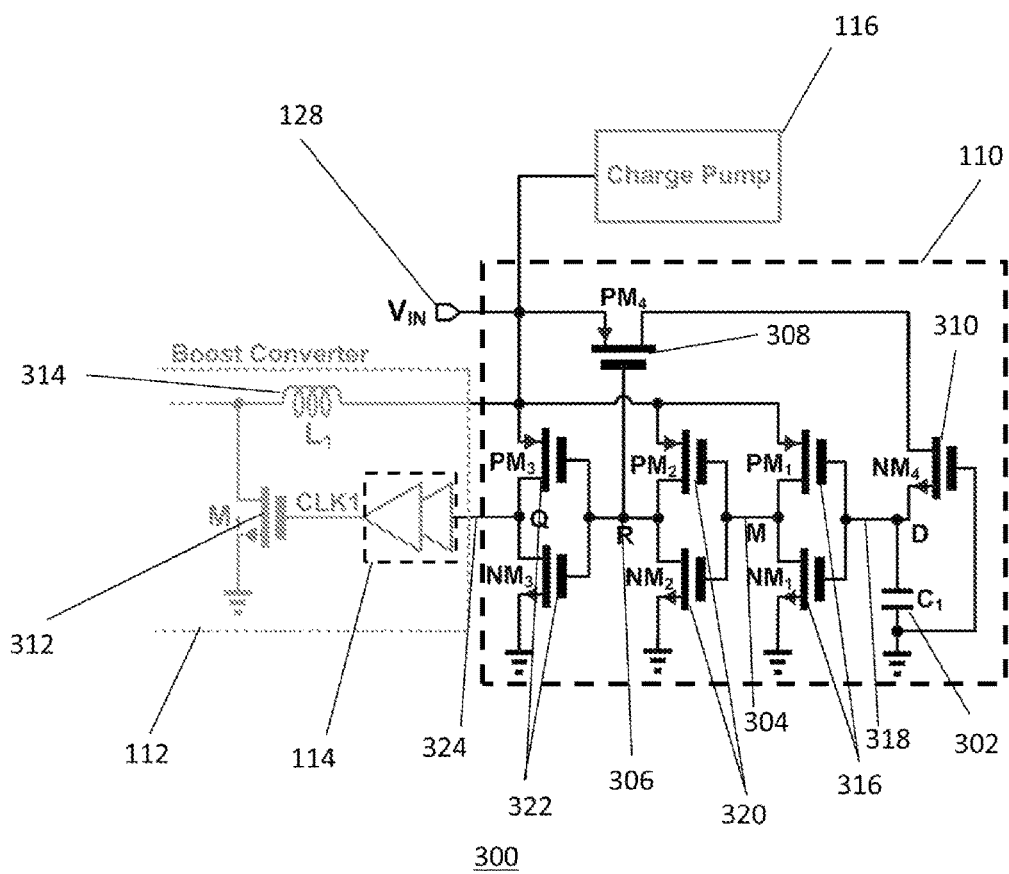
FIG. 3 is a schematic of circuitry of a start-up circuit in accordance with the present embodiment.

Referring to FIG. 3, a schematic of circuitry 300 depicts a start-up circuit 102 of the device for energy harvesting. As shown in FIG. 3 as well as FIG. 1, the POR circuit 110, in particular, comprises at least one energy storage device and multiple transistors coupled together. As such, the POR circuit 110 can be used for generating a sequence of pulses to control the self-oscillation of the start-up circuit 102. In this regards, the energy storage device of the POR circuit 110 can be any device capable of generating a sequence of pulses by charging and/or discharging for which the exemplary circuitry described herein utilizes a capacitor C1 302 as the energy storage device. Correspondingly, the transistors coupled together within the POR circuit 110 can be any device capable of controlling the charging and/or discharging of the energy storage device as well as controlling the inverter chain buffer 114 for generating the clock signals. As such, the example embodiment of the invention described herein uses field effect transistors, in particular, metal oxide semiconductor field effect transistor (MOSFET) as the transistors, however, other non-limiting examples may also include bipolar junction transistors, insulated-gate bipolar transistor or any other device and element with similar means to the transistor.

The auxiliary boost circuit 112 can be any device capable of boosting an input voltage of the start-up circuit, $V_{IN}$ 128 which can include non-limiting examples such as voltage amplifier circuits, transformer or boost converter circuits. Without prejudice to the generality of the foregoing, the auxiliary boost circuit described herein is a DC-DC boost converter circuit comprising at least one energy storage device and at least one switching device coupled to the at least one energy storage device for boosting the input voltage of the start-up circuit, $V_{IN}$ 128. The energy storage device of the auxiliary boost circuit can be any device capable of resisting transient current or voltage changes by charging and/or discharging wherein the example circuitry described herein uses an inductor L 314 as the energy storage device. The switching device coupled to the at least one energy storage device can be any device capable for controlling the charging and/or discharging of the energy storage device to boost voltage at an output of the auxiliary boost circuit wherein the example circuitry described herein uses a transistor 302 as the switching device. In particular, the transistor 302 can include non-limiting examples of bipolar junction transistor, insulated gate bipolar transistor, field effect transistor, metal oxide field effect transistor (MOSFET) or any other transistor element or device. In addition, similar to the main boost circuit 104, the auxiliary boost circuit 112 can further comprise a diode (not shown in FIG. 3) coupled to the energy storage device and the switching device to prevent reverse biasing when the energy storage device is charging and/or discharging. The diode can be implemented in passive or active manner. The start-up circuit 102 can also further comprise a charge pump circuit 116 or any device which can convert a lower oscillating voltage to a higher Direct Current (DC) voltage similar to that of a voltage multiplier circuit. Non-limiting examples of charge pump circuits can include Dickson charge pump, static charge transfer switches charge pump, switched-capacitor charge pumps, etc.

During the start-up processing, the capacitor C1 302 can be fully discharged and a voltage at node M 304 may follow the input voltage of the start-up circuit, $V_{IN}$ 128, so that a voltage at node R 306 can be kept at a logical low voltage. This results in transistor PM4 308 being turned on. The transistor PM4 308 and another transistor NM4 310 can provide a charging path from the input voltage 128 to the capacitor C1 302. The inverter chain buffer 114 can then output the clock signal CLK1 at a logical high voltage to turn on a transistor M1 312 to charge the inductor L1 314.

When the capacitor C1 302 is charged to a threshold voltage, an inverter 316, comprising transistors PM1 and NM1, can invert the voltage at node D 318 to a logical low voltage at node M 304. An inverter 320, comprising transistors PM2 and NM2, in turn, can switch the voltage at node R 306 to a logical high voltage which turns off transistor PM4 308 and prevents capacitor C1 302 from charging. The inverter chain buffer 114 as well as an inverter 322, comprising transistors PM3 and NM3, can switch off the transistor M1 312 in response to the voltage at node R 306 being at a logical high voltage. When the capacitor C1 302 is unable to charge, the capacitor C1 302 can start to discharge. As a result, input voltage of the start-up circuit, $V_{IN}$ 128, rises because of a reduction in current consumption and voltage drop due to the capacitor C1 302 discharging. When the capacitor C1 302 begins to discharge and the input voltage of the start-up circuit, $V_{IN}$ 128 increases, the two coupled inverters, comprising inverter 316 and inverter 320 switches the voltage at node R 306 to a logical low voltage and thereafter, the inverter 322 switches the voltage at node Q 324 back to a logical high voltage which magnitude is that of $V_{in}$ 128. This enables the clock signal CLK1 204 to turn transistor M1 312 weakly on. Consequently, the increase of $V_{IN}$ also causes the threshold voltage of the transistors to increase and transistor PM4 308 can be activated again. Hence, the capacitor C1 302 can be charged and the phenomena of charging and discharging continues, resulting in a series of pulses until the capacitor C1 302 is charged completely, fully resetting the POR circuit 110. As such, the capacitor C1 302 should be sized such that charging time of the capacitor C1 302 can provide a sufficiently long duration of pulses to boost $V_{OUT}$ and step-up $V_{CP}$. On the other hand, both an on-time and the charging time of the capacitor C1 302 should also optimize the POR circuit 110 such that the charging time of the capacitor C1 302 is also sufficiently short for the POR circuit 110 to reset completely after a finite number of pulses.

Figure 4:
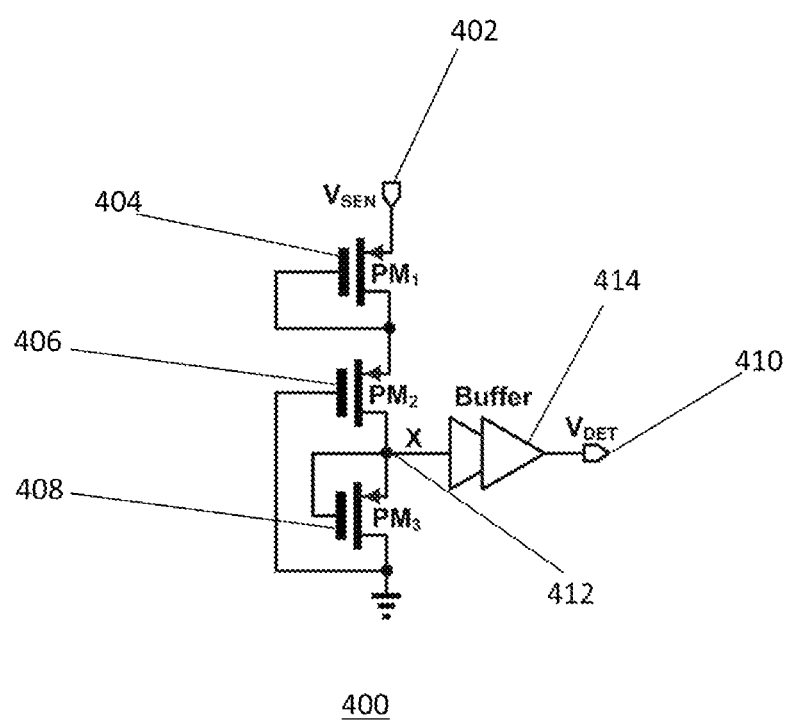
FIG. 4 is a schematic of circuitry of a voltage detector circuit in accordance with the present embodiment.

Referring to FIG. 4, a schematic of circuitry 400 depicting the voltage detector circuit 126 of the energy harvesting device in accordance with the present embodiment. $V_{SEN}$, an input voltage 402 of the voltage detector circuit 126 is coupled to the output voltage of the main boost circuit 104. Correspondingly, $V_{DET}$ 410 is an output voltage of the voltage detector circuit 126. The voltage detector circuit 126 can be designed in such a manner that when $V_{SEN}$ 402 is less than $V_{TH}$, $V_{TH}$ is a pre-determined threshold voltage to switch from start-up mode to main boosting operation mode. Voltage at node X 412 and $V_{DET}$ 410 can be at a logical low voltage, and when $V_{SEN}$ 402 is above $V_{TH}$, voltage at node X 412 and $V_{DET}$ 410 can follow $V_{SEN}$ 402. A non-limiting example of a voltage level of $V_{TH}$ can be 450 mV. Voltage buffer 414 boosts the voltage swing and provides driving capability for $V_{DET}$. Transistor PM1 404 can be in diode connection for providing voltage drop to limit the current passing through the voltage detector circuit 126. The connections of both transistors PM2 406 and PM3 408 are done in such a manner that both are off and weakly conducting in sub-threshold region. The current passing through the transistor PM2 406 is independent of $V_{SEN}$ 402 and constant. On the other hand, the current through PM3 408 varies with $V_{SEN}$ 402. The voltage at node X 412 can be switched from a logical low voltage to a logical high voltage when the current passing through both transistors PM2 406 and PM3 408 are equal. Transistors PM1 404, PM2 406 and PM3 408 can be any transistors wherein the example circuitry described herein uses a field effect transistor, in particular, a metal oxide semiconductor field effect transistor (MOSFET). Other non-limiting examples of transistors can also include bipolar junction transistor, insulated gate bipolar transistor) or any other transistor element or device. Notwithstanding the aforementioned, PM1 404 can also be a diode.

In view of the above, the value of $V_{SEN}$ 402 which triggers the logical low voltage to the logical high voltage at node X is referred to as a trigger value. As a result, when the trigger value is below $V_{TH}$, the voltage at node X 412 is at a logical low voltage. The multiplexer 124 which couples to the start-up circuit 102, the main boost circuit 104 and the clock generator circuit 106 in turn, selects $V_{CP}$, the output voltage of the start-up circuit as the voltage supply for the clock generator 106 to accelerate the start-up process. On the other hand, when $V_{SEN}$, the input voltage 402 of the voltage detector circuit 126 coupled to the output voltage 130 of the main boost circuit 104, $V_{OUT}$, is greater than $V_{TH}$, the output voltage of the voltage detector can be switched to $V_{OUT}$ 130 and hence, the multiplexer can select $V_{OUT}$, the output voltage 130 of the main boost circuit 104 to be the voltage output of the multiplexer. This generates a fixed duty cycle clock signal maintaining the main boost converter in steady-state. Moreover, switching the voltage supply of the clock generator circuit 106 from $V_{CP}$ to $V_{OUT}$ is important because, in absence of the reset and disabled POR output, the charge pump circuit will quickly discharge with any loading.

Lastly, the clock generator 106 can be utilized to control voltage boosting of the main boost circuit 104 during the steady state phase. The clock generator can comprise a ring oscillator 118 or any device capable of generating an oscillatory waveform in response to a voltage output by one of the start-up circuit 102 and the main boost circuit 104 at any point in time. Other non-limiting examples can also include a voltage control oscillator. In addition, the clock generator 106 can also further comprise a frequency divider 120 for frequency division of the oscillatory waveform frequency and an inverter chain buffer 122 for generating clock signals 210 from the output of the frequency divider for controlling voltage boosting by the main boost circuit during the steady state phase. As such, the example circuitry described herein uses a three-stage current starving ring oscillator together with a divide-by-4 frequency divider to generate a 125 kHz clock signal with a duty cycle of 12.5%. As such, duty cycling based on clock dividing has little dependence on process and voltage variation. This can also provide a tighter control on the voltage boost ratio for main voltage boost converter.

Figure 5:
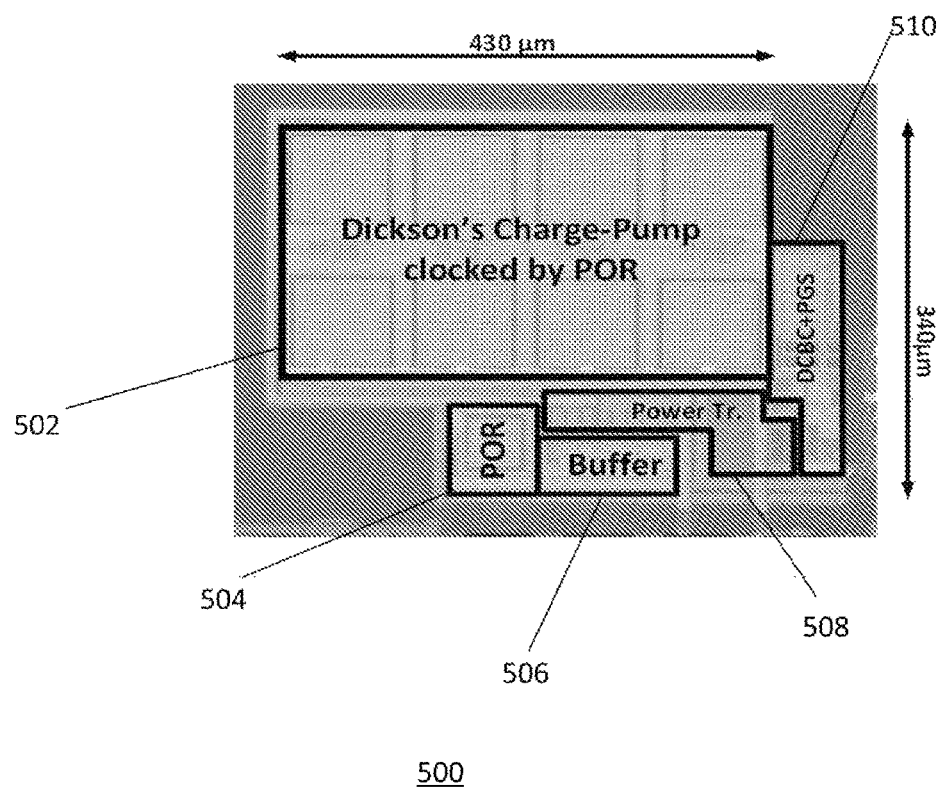
FIG. 5 is a top planar view depicting an exemplary chip implemented in a 65 nm complementary metal-oxide semiconductor (CMOS) technology in accordance with the present embodiment.

Referring to FIG. 5, a top planar view depicting a chip 500 implemented in a 65nm complementary metal-oxide semiconductor (CMOS) technology in accordance with the present embodiment. The circuit is packaged in QFN16 package and assembled onto a PCB board for testing. As shown in FIG. 5, the chip 500 has a circuit active area of 430µm by 340µm. The chip comprises circuitry as indicated in blocks as seen FIG. 5 which relates to that in FIG. 1 as follows: Dickson's charge pump block 502 relates to the charge pump circuit 116 clocked by a POR circuit 110, Power Transistor (Tr.) Block 508 relates to the auxiliary boost circuit 112 and the main boost circuit 104, buffer block 506 relates to the inverter buffer block 114 of the start-up circuit 102, POR 504 relates to the power on reset circuit 110 as well as DCBC and PGS block 510 relates to the switching circuit 108 and the clock generator circuit 106 respectively. In addition, the required off-chip components include an inductor of 1 mH and a storage capacitor of 560 pF.

Figures 6A, 6B:
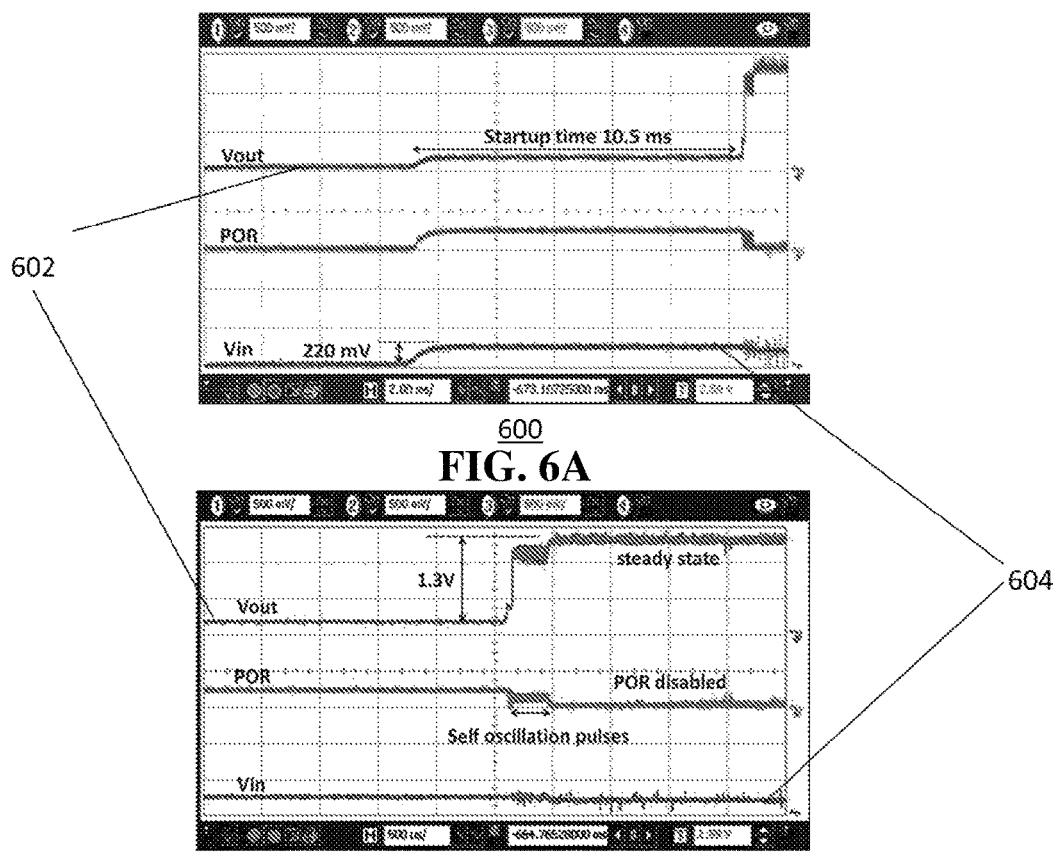

Measurements are carried out on the chip with a voltage source in series with a 350Ω resistance to emulate a TEG. Referring to FIG. 6, comprising FIGS. 6A-6B, are illustrations depicting examples of the measured start-up transient voltage waveforms with an input voltage of the chip 500 at 220mV in accordance with the present embodiment, wherein FIG. 6A depicts an overall measured start-up transient voltage waveforms 600 and FIG. 6B depicts a zoom-in measured start-up transient voltage waveforms 606. As shown in FIG. 6, voltage output 602 of the chip 500 is 1.3V when input voltage 604 of the chip 500 is 220 mV and the start-up time at 200 mV is 10.5 ms. Thereafter, voltage magnitude to sustain steady-state operation after start-up phase is 75 mV with a quiescent power of 0.45 µW. The measured peak efficiency of the main boost circuit is 73.3% at 200 mV input.

Figure 7:
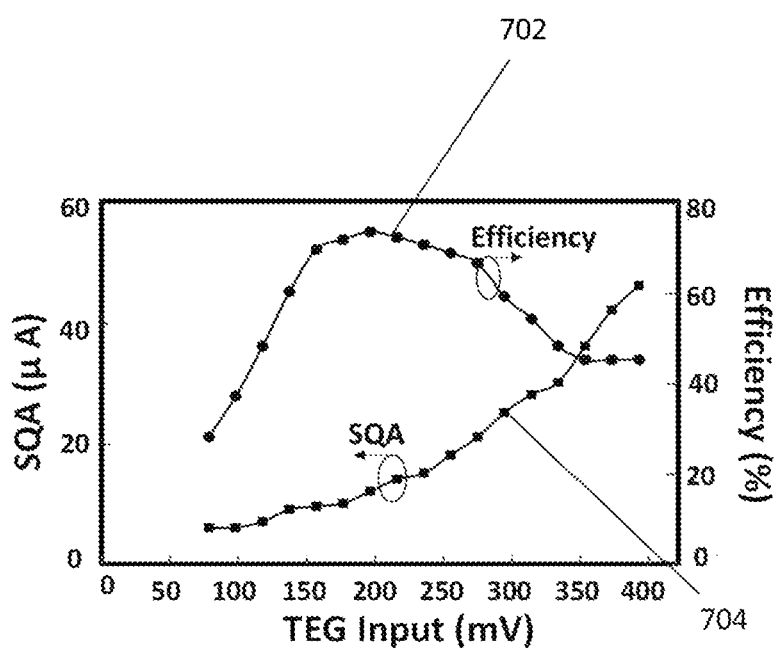
FIG. 7 is a graph depicting examples of a start-up quiescent current (SQA) and efficiency of a Power-on Reset (POR) circuit against an input voltage of the POR circuit.

Referring to FIG. 7, an illustration 700 depicts examples of a start-up quiescent current (SQA) 704 and efficiency 702 of the POR circuit 110 against the input voltage 128 of the POR circuit 110, $V_{IN}$. Ratio of a quiescent power of the POR circuit 110 over input power of the POR circuit 110 at 75 mV is only 1.2%. As shown in FIG. 7, the efficiency 704 of the POR circuit 110 rises with increasing available input voltage 128 of the POR circuit 110 and peaks in the region between 150-300 mV. Thereafter, the efficiency 702 of the POR circuit 110 starts decaying. The trend of decaying efficiency 702 of the POR circuit 110 is observed because the input voltage 128 of the POR circuit 110 approaches a threshold of the transistor of the POR circuit 110. Hence, the transistor of the POR circuit 110 is no longer weakly turned on by the POR pulses resulting in an increase in power loss during start-up phase.

As a result, the device for energy harvesting provides an auto-disabling function which is critical for practical application of start-up circuit. In addition, the device for energy harvesting can also achieved low static power and hence, higher efficiency.

Figure 8:
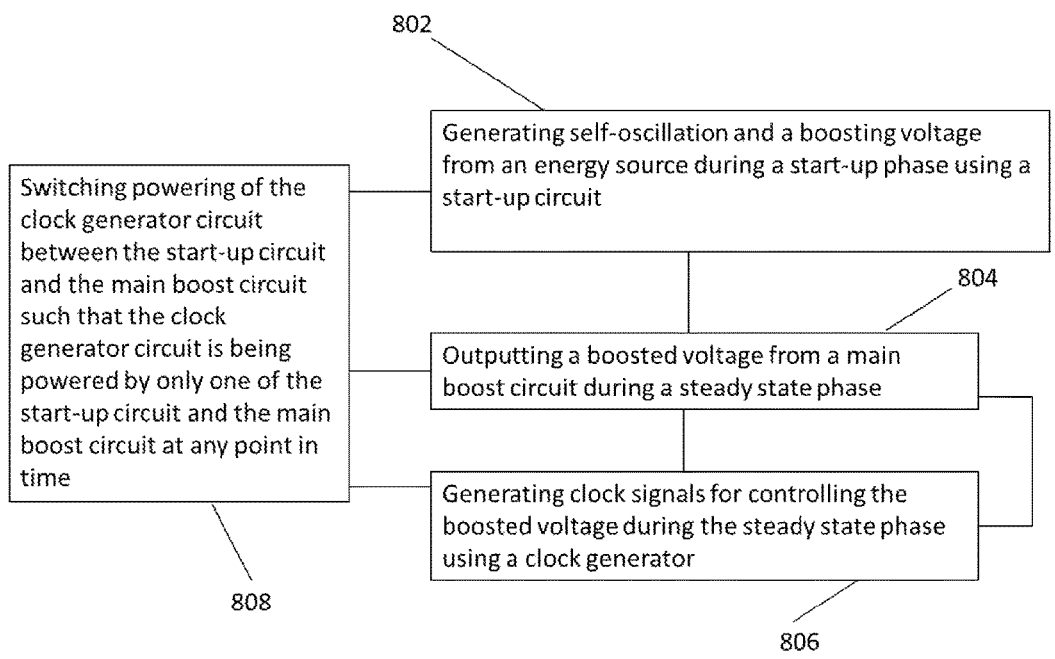
FIG. 8 is a flow chart depicting a method for energy harvesting in accordance with the present embodiment.

Referring to FIG. 8, is a flow chart 800 depicting the method for energy harvesting in accordance with the present embodiment. The method for energy harvesting as depicted in FIG. 8 may be performed by a device for energy harvesting which is described with reference to FIG. 1 or any device capable of functioning similarly to the device for energy harvesting. This may include the use of other non-limiting examples such as micro-controllers or processors. The flow chart 800 of the energy harvesting method provides an overview of the functional flow of the energy harvesting method in accordance with the present embodiment. Likewise, the method described hereinafter only provides a general outline of the method for energy harvesting. It can be understood by those skilled in the art that the method described hereinafter can be combined with any pertaining portions described herein to supplement the details of each step of the method. As such, the method for energy harvesting 802 can first generate self-oscillation and a boosting voltage from an energy source, using a start-up circuit 102 during a start-up phase. In particular, the said step of the method 802 can first involve generating a sequence of pulses for control of the self-oscillation using a POR circuit 110 before the POR circuit 110 resets and the start-up circuit 102 is disabled. The said step of the method 802 can further include generating a sequence of clock signals from the sequence of pulses using an inverter chain buffer 114 to drive the charge pump 116 and the auxiliary boost circuit 112 after the POR circuit 110 resets. Subsequently, the said step of the method 802 can also include boosting an input voltage of the start-up circuit 128 from the sequence of clock signals using an auxiliary boost circuit 112 controlled by the power-on reset circuit 110 as well as the charge pump 116. Lastly, powering the clock generator 106 can be achieved in response to the boosted voltage from the auxiliary boost circuit 112 and the charge pump circuit 116 as well as the sequence of clock signals from the inverter chain buffer 114. As a side note, prior to generating self-oscillation, the output voltage of the POR circuit 110 can follow its input voltage $V_{IN}$ 128.

During the steady state phase, outputting a boosted voltage can be from a main boost circuit 804. The method of outputting a boosted voltage 804 can include fully powering up the clock generator 106 by the start-up circuit 102, activating the main boost circuit 104 when the clock generator 106 is fully powered up as well as disabling the start-up circuit 102 and enabling the main boost circuit 104 to power the clock generator 106 when the output boosted voltage of the main boost circuit, $V_{OUT}$ 130 is above a threshold voltage. The method of outputting a boosted voltage 804 can further include generating a fixed duty cycle clock signal using the clock generator 106 to control the output boosted voltage of the main boost circuit, $V_{OUT}$ 130 during the steady state phase.

In addition, the method for energy harvesting 806 also includes generating clock signals for controlling the boosted voltage, $V_{OUT}$ 130 during the steady state phase using a clock generator 106. In particular, the method of generating clock signals for controlling the boosted voltage 806 can include detecting an output voltage magnitude of the boosted voltage of the main boost circuit, $V_{OUT}$ 130, outputting specific electrical signals based on the detection of the output voltage magnitude of the boosted voltage 130 of the main boost circuit 104, $V_{OUT}$. The method of generating clock signals for controlling the boosted voltage 806 can further include automatically switching between a voltage output of the start-up circuit 102 and the main boost circuit 104, $V_{OUT}$ 130 using a multiplexer 124 in response to the output voltage magnitude of the boosted voltage 130 of the main boost circuit 104, generating an oscillatory waveform using a ring oscillator 118, frequency dividing the oscillatory waveform using a frequency divider 120, generating clock signals from an output of the frequency divider 120 for controlling voltage boosting of the output of the main boost circuit 104 during the steady state phase using an inverter chain buffer 122 and driving the ring oscillator 118, frequency divider 120 and inverter chain buffer 122 by either the main boost circuit 104 or the start-up circuit 102 in response to an output of the multiplexer 124.

Lastly, the method for energy harvesting 808 can also include switching powering of the clock generator circuit between the start-up circuit 102 and the main boost circuit 104 such that the clock generator circuit 106 can be powered by only one of the start-up circuit 102 and the main boost circuit 104 at any point in time.

Thus, the present embodiment combining a device and method for energy harvesting using a self-oscillating power-on reset start-up circuit provides an optimal solution which delivers a high efficient power conversion rate for a low voltage power source. This advantageous device and method minimize the power consumption of the device through the auto-disabling nature of the start-up circuit during steady-state operation resulting in low static power and high efficient power conversion rate. While exemplary inventions have been presented in the foregoing detailed description of the embodiments, it should be appreciated that a vast number of variations exist.

Where a component (e.g. device, circuit, etc.) is referred to above, unless otherwise indicated, reference to that component (including a reference to a "means") should be interpreted as including as equivalent of any component which performs the function of the described component (that is functionally equivalent), including components which are not structurally equivalent to the disclosed structure which performs the function in the illustrated exemplary embodiments of the invention It should further be appreciated that the exemplary inventions are only examples, and are not intended to limit the scope, applicability, operation, or configuration of the embodiments in any way. Rather, the foregoing detailed description will provide those skilled in the art with an efficient energy harvesting device and method for implementing an exemplary embodiments of the embodiments, it being understood that various changes may be made in the function and arrangement of elements and method of operation described in an exemplary embodiments without departing from the scope of the embodiments as set forth in the appended claims.

What is claimed is:

1. A device for energy harvesting, comprising:
   a start-up circuit including a power-on reset circuit for generating a sequence of pulses to control self-oscillation of the start-up circuit, an auxiliary voltage boost circuit coupled to the power-on reset circuit and an input of the start-up circuit for boosting an input voltage of the start-up circuit, and a feedback loop including an energy source, the auxiliary voltage boost circuit and the power-on reset circuit such that the start-up circuit generates the sequence of pulses for self-oscillation through the feedback loop for initial boosting of the input voltage from the energy source;
   a main boost circuit for boosting the input voltage during a steady state phase;
   a clock generator circuit for generating clock signals which control voltage boosting of the main boost circuit during the steady state phase; and
   a switching circuit coupled to the start-up circuit, the main boost circuit and the clock generator circuit for switching powering of the clock generator circuit between the start-up circuit and the main boost circuit such that the clock generator circuit is powered by only one of the start-up circuit and the main boost circuit at any point in time.

2. The device in accordance with claim 1, wherein the start-up circuit comprises:
   an inverter chain buffer, comprising a plurality of inverters coupled in a chain configuration driven by the power-on reset circuit, for generating a sequence of clock signals to drive the auxiliary boost circuit; and
   a charge pump circuit driven by the inverter chain buffer and coupled to the input of the start-up circuit for powering the clock generator circuit.

3. The device in accordance with claim 2, wherein the power-on reset (POR) circuit comprises:
   at least one POR energy storage device for generating a sequence of pulses by charging and discharging until the at least one POR energy storage device is fully charged resetting the power-on reset circuit; and
   a plurality of transistors coupled together for controlling the charging and discharging of the at least one POR energy storage device and for controlling the inverter chain buffer.

4. The device in accordance with claim 3, wherein the at least one POR energy storage device comprises at least one capacitor.

5. The device in accordance with claim 3, wherein the plurality of transistors comprises field-effect transistors.

6. The device in accordance with claim 2, wherein the auxiliary boost circuit (ABC) comprises:
   at least one ABC energy storage device for resisting transient current or voltage changes by charging and/or discharging;
   at least one ABC switching device coupled to the at least one ABC energy storage device for controlling the charging and/or discharging of the at least one ABC energy storage device to boost voltage at an output of the auxiliary boost circuit; and
   at least one ABC diode coupled to the at least one MBC energy storage device and the at least one at least one ABC switching device to prevent reverse biasing when the at least one ABC energy storage device is charging and/or discharging.

7. The device in accordance with claim 6, wherein the at least one ABC energy storage device comprises an inductor and/or a capacitor.

8. The device in accordance with claim 6, wherein the at least one switching device comprises at least one field-effect transistor.

9. The device in accordance with claim 2, wherein the charge pump circuit (CPC) comprises a Dickson charge pump circuit.

10. The device in accordance with claim 1, wherein the main boost circuit (MBC) comprises:
    at least one MBC energy storage device for resisting changes in current or voltage by charging and/or discharging;
    at least one MBC switching device coupled to the at least one MBC energy storage device for controlling the charging and/or discharging of the at least one MBC energy storage device to boost voltage at an output of the main boost circuit; and at least one MBC diode coupled to the at least one MBC energy storage device and the at least one at least one MBC switching device to prevent reverse biasing when the at least one MBC energy storage device is charging and/or discharging.

11. The device in accordance with claim 10, wherein at least one ABC energy storage device of the auxiliary boost circuit is a same energy storage device as at least one of the at least one MBC energy storage device.

12. The device in accordance with claim 1, wherein the clock generator circuit comprises:
a ring oscillator for generating an oscillatory waveform in response to a voltage output by only one of the start-up circuit and the main boost circuit at any point in time;
a frequency divider for frequency division of the oscillatory waveform; and
an inverter chain buffer for generating clock signals from the output of the frequency divider for controlling voltage boosting by the main boost circuit during the steady state phase,
wherein the ring oscillator, the frequency divider and the inverter chain buffer are driven by the main boost circuit or the start-up circuit in response to an output of the switching circuit.

13. The device in accordance with claim 12, wherein the ring oscillator comprises a three-stage current starving ring oscillator.

14. The device in accordance with claim 1, wherein the switching circuit comprises:
a voltage detector circuit for detecting a voltage magnitude at an output of the main boost circuit and outputs specific electrical signals based on the voltage magnitude detected; and
a multiplexer for automatically switching between one of the start-up circuit and the main boost circuit based on the specific electrical signals output from the voltage detector circuit.

15. The device in accordance with claim 14, wherein the voltage detector circuit comprises:
at least one first transistor in diode connection to an input of the voltage detector circuit to provide a voltage drop for limiting current passing through the voltage detector circuit;
at least one second transistor which has current passing through independent of the voltage magnitude detected at the output of the main boost circuit and is constant; and
at least one third transistor which is current dependent of the voltage magnitude detected at the output of the main boost circuit,
wherein the at least one first transistor, the at least one second transistor and the at least one third transistor are coupled in series and an output voltage measured between the at least one second transistor and the at least one third transistor switches from a logical low voltage to a logical high voltage when currents of the at least one second transistor and the at least one third transistor are equal.

16. The device in accordance with claim 15, wherein the voltage detector circuit further comprises a voltage buffer coupled at the output voltage measurement point of the voltage detector circuit to boost voltage swing and drive the output voltage of the voltage detector circuit.

17. A method for energy harvesting, comprising:
generating self-oscillation and a boosting voltage from an energy source during a start-up phase using a start-up circuit by generating a sequence of pulses for control of the self-oscillation using a power-on reset circuit, generating a sequence of clock signals from the sequence of pulses using an inverter chain buffer, and boosting an input voltage of the start-up circuit from the sequence of clock signals using an auxiliary boost circuit controlled by the power-on reset circuit and a charge pump circuit;
outputting a boosted voltage from a main boost circuit during a steady state phase;
generating clock signals for controlling the boosted voltage during the steady state phase using a clock generator; and
switching powering of the clock generator circuit between the start-up circuit and the main boost circuit such that the clock generator circuit is being powered by only one of the start-up circuit and the main boost circuit at any point in time.

18. The method for energy harvesting in accordance with claim 17, wherein the step of generating the self-oscillation and the boosting voltage from the energy source during the start-up phase comprises:
powering the clock generator in response to the boosted voltage from the auxiliary boost circuit and the charge pump circuit and the sequence of clock signals from the inverter chain buffer.

19. The method for energy harvesting in accordance with claim 17, wherein the step of outputting the boosted input voltage during the steady state phase comprises:
fully powering up the clock generator by the start-up circuit;
activating the main boost circuit when the clock generator is fully powered up;
disabling the start-up circuit and enabling the main boost circuit to power the clock generator when the output boosted voltage of the main boost circuit is above a threshold voltage; and
generating a fixed duty cycle clock signal using the clock generator to control the boosted voltage of the main boost circuit during the steady state phase.

20. The method for energy harvesting in accordance with claim 17, wherein the step of generating clock signals for controlling boosting of the main boost circuit input voltage during the steady state phase comprises:
detecting an output voltage magnitude of the boosted voltage of the main boost circuit;
outputting specific electrical signals based on the detection of the output voltage magnitude of the boosted voltage of the main boost circuit;
automatically switching between an output of the start-up circuit and the main boost circuit using a multiplexer in response to the output voltage magnitude of the boosted voltage of the main boost circuit;
generating an oscillatory waveform using a ring oscillator;
frequency dividing the oscillatory waveform;
generating clock signals from an output of the frequency divider for controlling voltage boosting of the output of the main boost circuit during the steady state phase using an inverter chain buffer; and
driving the ring oscillator, frequency divider and inverter chain buffer by either the main boost circuit or the start-up circuit in response to an output of the multiplexer.

* * * * *